United States Patent
Malone et al.

(10) Patent No.: US 7,548,421 B2
(45) Date of Patent: Jun. 16, 2009

(54) IMPINGEMENT COOLING OF COMPONENTS IN AN ELECTRONIC SYSTEM

(75) Inventors: Christopher G. Malone, Loomis, CA (US); Wade Vinson, Magnolia, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 11/259,544

(22) Filed: Oct. 25, 2005

(65) Prior Publication Data

US 2007/0091565 A1    Apr. 26, 2007

(51) Int. Cl.
*H05K 7/20* (2006.01)
(52) U.S. Cl. ...................................... 361/695
(58) Field of Classification Search ................. 361/695, 361/697
See application file for complete search history.

(56) References Cited

U.S. PATENT DOCUMENTS

| | | | |
|---|---|---|---|
| 5,183,104 A | 2/1993 | Novotny | |
| 5,220,804 A | 6/1993 | Tilton et al. | |
| 5,297,005 A | 3/1994 | Gourdine | |
| 5,497,825 A | 3/1996 | Yu | |
| 5,559,673 A | 9/1996 | Gagnon et al. | |
| 5,818,692 A | 10/1998 | Denney, Jr. et al. | |
| 5,917,697 A | 6/1999 | Wang | |
| 6,019,165 A | 2/2000 | Batchelder | |
| 6,113,485 A | 9/2000 | Marquis | |
| 6,223,813 B1 | 5/2001 | Chrysler et al. | |
| 6,280,318 B1 | 8/2001 | Criss-Puszkiewicz et al. | |
| 6,408,941 B1 | 6/2002 | Zuo | |
| 6,498,725 B2 | 12/2002 | Cole et al. | |
| 6,529,377 B1 | 3/2003 | Nelson et al. | |
| 6,650,542 B1 | 11/2003 | Chrysler et al. | |
| 6,755,242 B2 | 6/2004 | White | |
| 6,787,691 B2 | 9/2004 | Fleurial et al. | |
| 6,790,744 B2 | 9/2004 | Chen et al. | |
| 6,830,097 B2 | 12/2004 | Wattelet et al. | |
| 6,876,550 B2* | 4/2005 | Sri-Jayantha et al. | 361/699 |
| 7,064,957 B1* | 6/2006 | Liang et al. | 361/719 |
| 2004/0060690 A1 | 4/2004 | Wattelet et al. | |
| 2004/0159422 A1 | 8/2004 | Zuo et al. | |
| 2004/0250562 A1 | 12/2004 | Adiga et al. | |
| 2005/0056404 A1* | 3/2005 | Lee et al. | 165/104.33 |
| 2005/0073812 A1 | 4/2005 | Lin | |
| 2005/0081532 A1* | 4/2005 | Scott | 62/3.2 |
| 2005/0082040 A1* | 4/2005 | Lee et al. | 165/104.33 |

(Continued)

FOREIGN PATENT DOCUMENTS

JP        2002261220         9/2002

OTHER PUBLICATIONS

Evelyn N. Wang et al., Micromachined Jets for Liquid Impingement Cooling of VLSI Chips, Journal of Microelectromechanical Systems, vol. 13, No. 5, Oct. 2004, pp. 833-842.

(Continued)

*Primary Examiner*—Jean F Duverne

(57) ABSTRACT

A cooling apparatus adapted for impingement cooling of electronic components in an electronic system comprises an air mover, one or more heat sinks configured with multiple fins, and one or more flexible tubing segments. The flexible tubing segments are coupled to the air mover and are configured to direct airflow onto the heat sinks for impingement cooling.

19 Claims, 15 Drawing Sheets

U.S. PATENT DOCUMENTS

2005/0098299 A1* 5/2005 Goodson et al. ............ 165/80.3
2005/0178528 A1* 8/2005 Ohashi et al. .............. 165/80.3
2005/0180103 A1* 8/2005 Ku ............................. 361/695
2005/0180105 A1* 8/2005 Matsushima et al. ........ 361/699

OTHER PUBLICATIONS

Luc Mongeau et al., Experimental Investigations of an Electro-Dynamically Driven Thermoacoustic Cooler, International Mechanical Engineering Congress and Exposition (IMECE) ASME 2001, pp. 1-12.

Evenlyn N. Wang et al., Micromachined Jet Arrays for Liquid Impingement Cooling of VLSI Chips, NNUN Abstracts 2002, Electronics, p. 28.

Evenlyn N. Wang et al., Micromachined Jet Arrays for Liquid Impingement Cooling of VLSI Chips.

Evelyn Wang, Microjet Impingement Cooling , Evelyn Wang Research Page, http://www.stanford.edu/~enwang/research.htm., pp. 1-3.

Z.J. Zuo et al., Compact, Double Side Impingement, Air-To-Air Heat Exchanger, Thermacore, Inc., 780 Eden Road, Lancaster, PA 17601, USA.

S. Wu et al., Micro Heat Exchanger by Using Mems Impinging Jets, Electrical Engineering 136-93, California Institute of Technology, Pasadena, CA 91125.

Japanese Office Action dated May 1, 2008 (Translated into English).

* cited by examiner

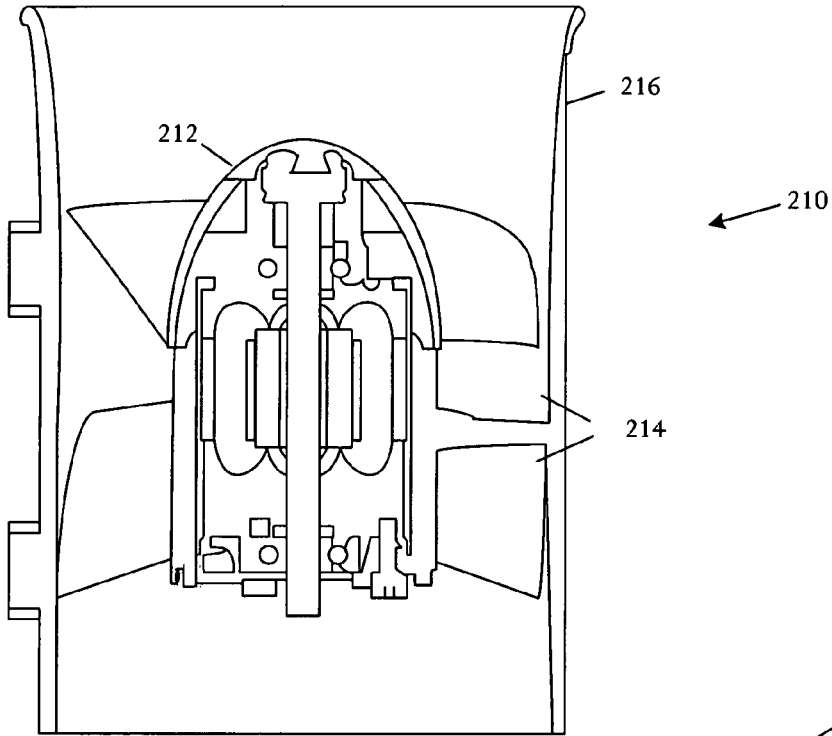
FIG. 2B(i)
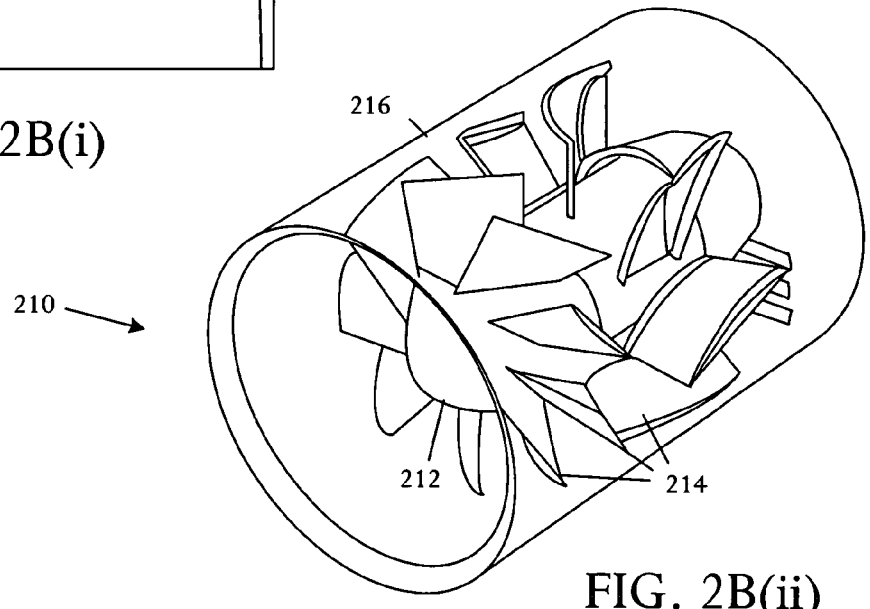
FIG. 2B(ii)

IMPINGEMENT COOLING OF COMPONENTS IN AN ELECTRONIC SYSTEM

BACKGROUND OF THE INVENTION

The difficulty of cooling high power electronic systems such as microprocessor systems has grown in recent years as a result of demand for vastly more powerful processors combined with a similarly strong demand for smaller system form factors. Thus, introduction of faster, higher performance semiconductors coincides with a concomitant increase in heat concentration problems. The generated thermal energy is intense with semiconductor chips that dissipate more than 100 watts of power.

Various structures and techniques may be used to attain suitable thermal engineering. Heat is generated by microelectronic chips and is removed to the surrounding air stream. Flowing heat is countered by thermal resistance impeding heat removal. Semiconductor and integrated circuit performance and reliability are absolutely constrained by temperature. Failure rate increases exponentially with rise in junction temperature with a myriad of device temperature-related failure modes including aspects of thermal runaway, gate dielectric strength, electro-migration diffusion, junction fatigue, electrical parameter shifts, and others, any of which may result in semiconductor failure.

Thermal engineering approaches typically involve supply of ventilation of ambient air around processing units including supply of simple ventilation holes or slots and installation of motorized fans in processing system cabinets. Other thermal engineering approaches include usage of fan-type assemblies mounted on or near heat-dissipating electronic components and devices. These techniques commonly realize only nominal benefit often with a disproportionate increase in system cost and complexity.

SUMMARY

In accordance with an embodiment of a cooling apparatus adapted for impingement cooling of electronic components in an electronic system, an air mover adapted to deliver a large pressure gradient supplies air flow to one or more heat sinks via one or more flexible tubing segments. The flexible tubing segments are coupled to the air mover and are configured to direct airflow onto the heat sinks for impingement cooling.

BRIEF DESCRIPTION OF THE DRAWINGS

Embodiments of the invention relating to both structure and method of operation may best be understood by referring to the following description and accompanying drawings:

FIGS. 2B(i) and 2B(ii) are a side view and a transparent, perspective view illustrating an example of a high flow rate air mover that may be used in an impingement cooling apparatus;

DETAILED DESCRIPTION

A relatively high-power air mover, for example such as a turbine-type blower, high-power fan, or other suitable device, enables a high airflow rate at a very high static pressure, thereby producing an increased or maximized heat transfer coefficient. The air mover creates a high-speed airflow and drives the high-speed airflow through tubing with a small internal diameter, resulting in a large pressure drop. Pressure drop reflects energy loss caused by friction and turbulence. In one potential use of the air mover, very small diameter tubing directs high-speed airflow to the heat sink, enabling impingement cooling.

The relatively high-power air mover and the flexible tubing with a small cross-sectional interior lumen combine to deliver air at very high speeds and possibly small air volume. High-power performance of the air mover and the small cross-sectional area of the tubing's lumen increase the pressure drop, creating conditions highly appropriate for efficient impingement cooling with airflow ducted directly to the inlet of a heat sink.

In various configurations, airflow may be applied to a heat sink using either push or pull arrangements. For example, air can be supplied by blowing directly to the inlet side of the heat sink. In another example, an air mover may be connected to draw air from the outlet side of the heat sink.

The thermal techniques and structures disclosed herein generate high velocity airflow for increased cooling effectiveness. Usage of flexible tubing for delivering the high velocity air stream enables precise airflow control.

Figure 1A:
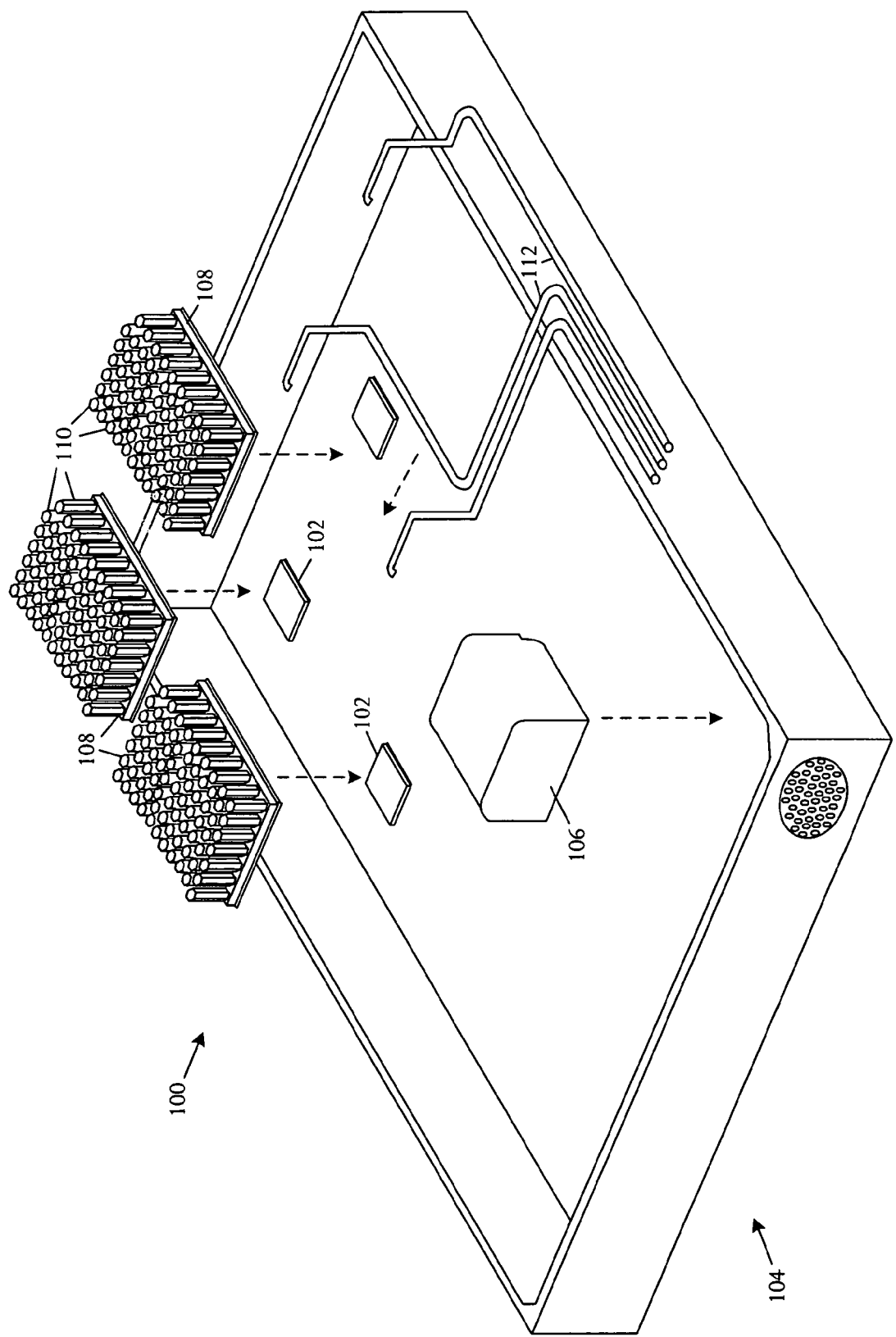
FIGS. 1A and 1B are schematic pictorial diagrams respectively illustrating exploded and combined views of an embodiment of a cooling apparatus adapted for impingement cooling of electronic components in an electronic system.
Figure 1B:
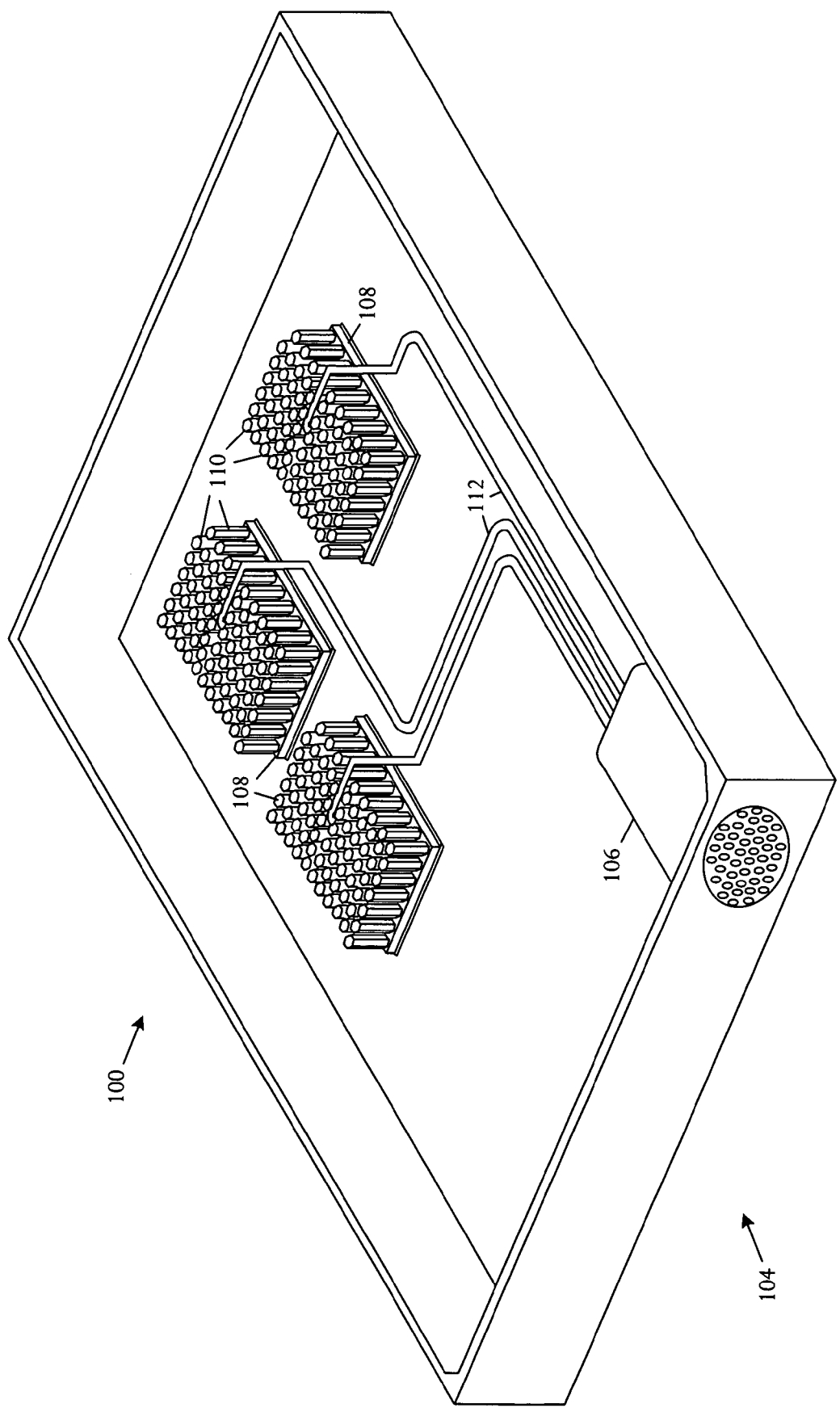

Referring to FIGS. 1A and 1B, schematic pictorial diagrams respectively illustrate an exploded and a combined view of an embodiment of a cooling apparatus 100 adapted for impingement cooling of electronic components 102 in an electronic system 104. The cooling apparatus 100 comprises an air mover 106, one or more heat sinks 108 configured with multiple fins 110, and one or more flexible tubing segments 112. The flexible tubing segments 112 are coupled to the air mover 106 and are configured to direct airflow onto the heat sinks 108 for impingement cooling of the electronic components 102.

The air mover 106 draws input air from the environment external to a system housing or chassis and applies high-velocity airflow to tubes 112 directly feeding the heat sinks 108.

The illustrative cooling apparatus 100 is used to cooling the electronic component or components 102 by positioning a heat sink 108 adjacent to or in the vicinity of the electronic component 102 and blowing an airflow stream onto the heat sink 108 with airflow velocity sufficiently high to produce impingement cooling of the electronic component 102. The flexible tubing 112 is coupled to the air mover 106 and positioned to extend to the heat sink 108 so that high-speed airflow is blown directly onto the heat sink 108. The flexible tubing 112 is used which has an small diameter which, in combination with the air mover 106, results in high-velocity for impingement cooling of the electronic component 102.

Impingement cooling is a thermal process or phenomenon for heat transfer by collision. A jet of air may be applied to the base of a pin-fin heat sink at any suitable angle of application. Heat is transferred as fluid hits a surface. At and around the impact region, a very thin boundary layer forms, enabling the heat transfer. A high-velocity cold air jet is directed from a hole in the tubing 112 at an angle that may be near vertical to the component surface. The cooling air jet hits the surface and is diverted in directions parallel to the impingement surface, creating a substantial cooling effect that decreases continuously in proportion to distance from the impingement point. When the cooling jet impinges on the surface, very thin hydrodynamic and thermal boundary layers form in the impingement region as a result of air jet deceleration and a pressure increase. A region called a stagnation zone occurs due to extremely high heat transfer coefficients. Peak heat transfer occurs only within the stagnation zone.

Single jet impingement effectively produces highly localized cooling. For large surface area applications, multiple-jet impingement can be applied using an array of round or slot jets. For example in some embodiments, the tubing 112 may be formed with a large number of holes arranged in one or more rows, thereby ensuring efficient impingement cooling of larger surface area.

Figure 8:
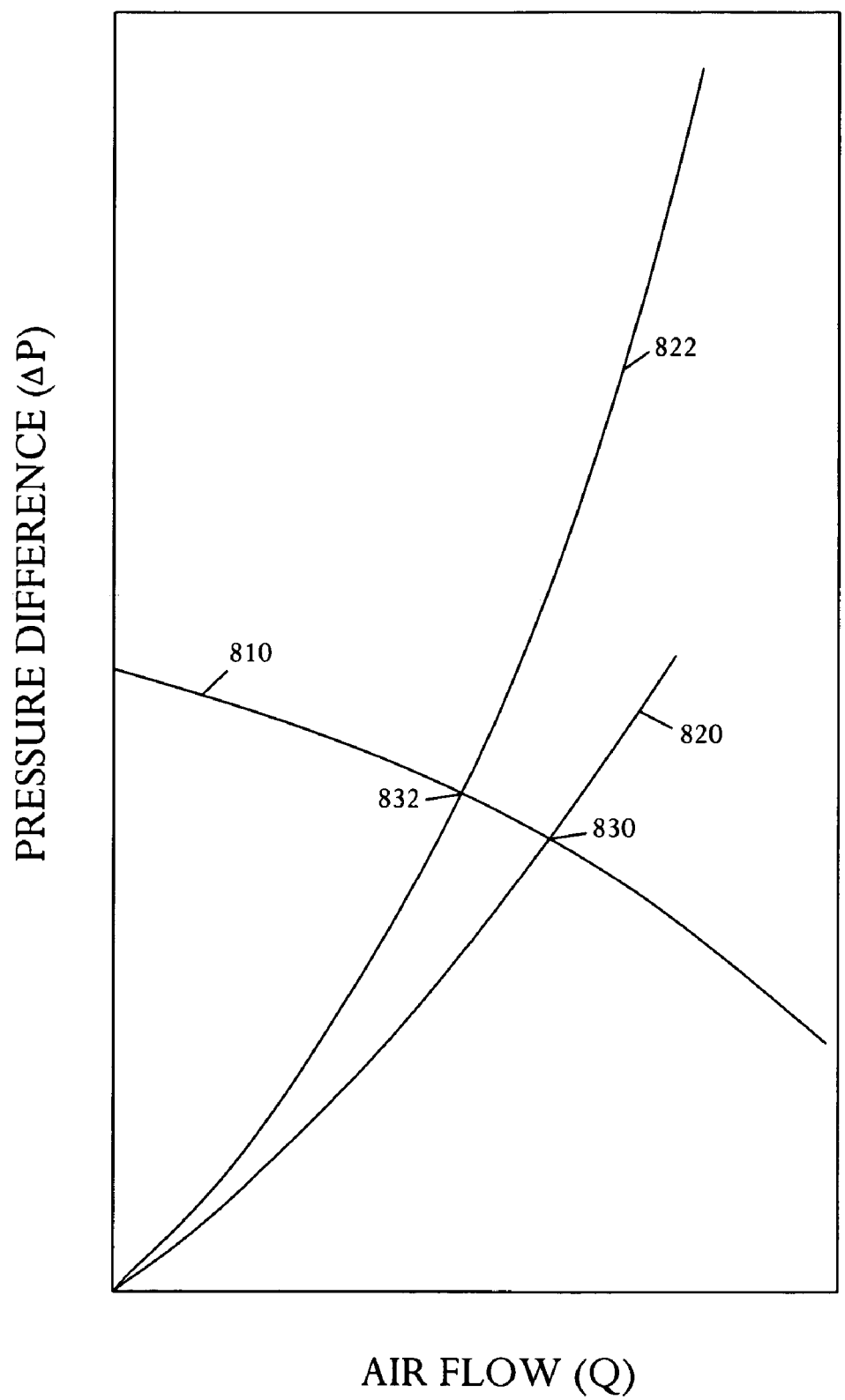
FIG. 8 is a schematic graph showing a fan characteristic curve and comparative system curves depicting standard cooling operation and comparison with an illustrative embodiment of an impingement cooling implementation.

The flexible tube or tubing 112 makes a substantially airtight connection to the air mover 106, restricting the outlet side of the air mover 106 to drive or force air through the tubes 112. The tubing 112 has a high resistance to airflow which, in combination with the high velocity and high pressure of airflow produced by the air mover 106, results in a fan-system operating point with improved efficiency, as shown in FIG. 8 and described hereinafter. The flexible tubing 112 is arranged to drive airflow precisely to selected locations and positions rather than allowing a possibly chaotic airflow typical with conventional fan configurations. The air mover 106 and flexible tubules 112 generate an increasingly high airflow velocity as the cross-sectional area of the flexible tubes 112 and/or the power of the air mover 106 are increased, elevating the system cooling efficiency.

Figure 2A:
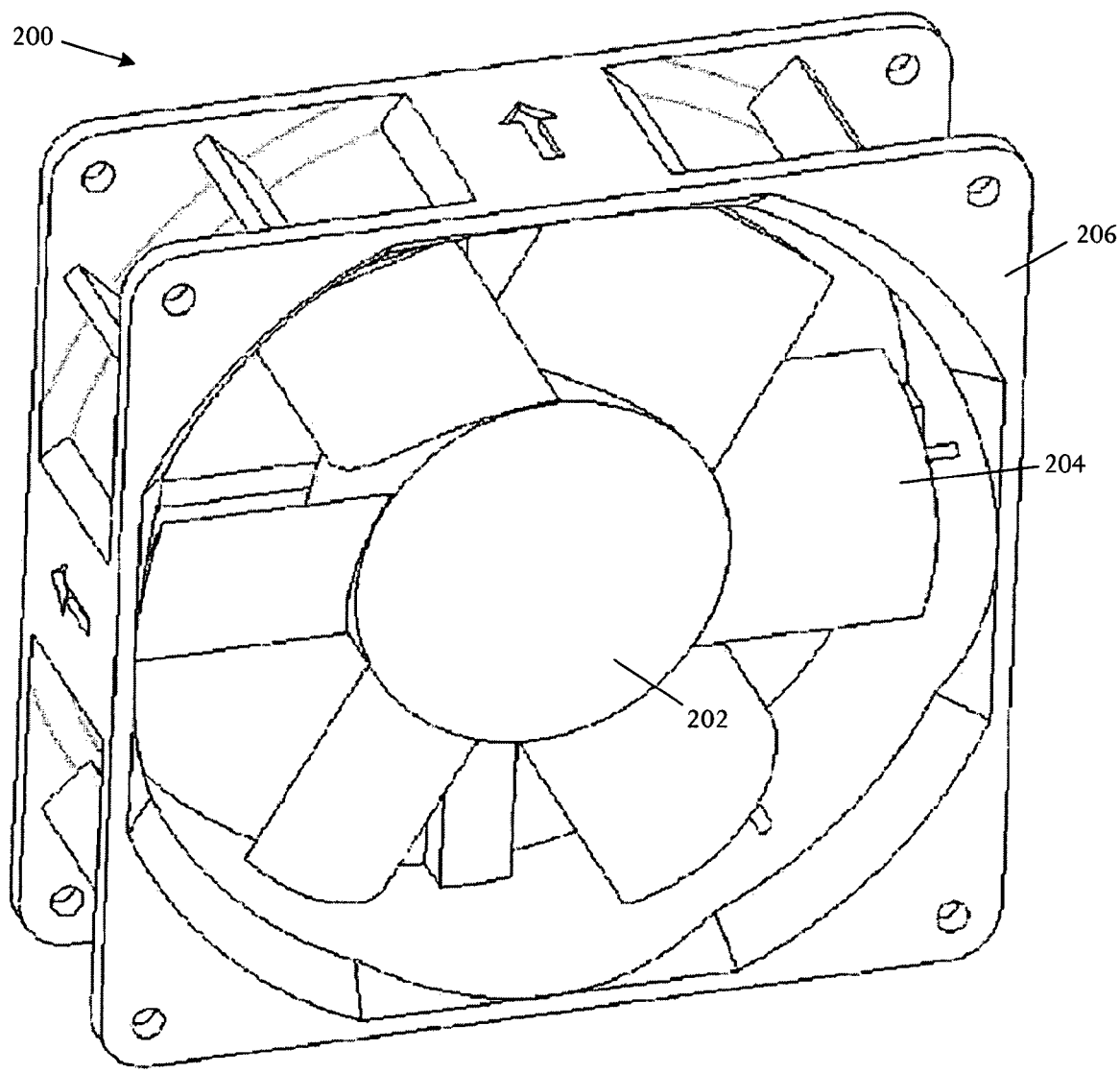
FIG. 2A is a perspective pictorial view showing an embodiment of a tube-axial fan that is suitable for usage in an impingement cooling apparatus.

Referring to FIGS. 2A, 2B(i), 2B(ii), and 2C, several pictorial diagrams depict examples of various air movers that may be suitable for usage in various impingement cooling apparatus embodiments. Impingement cooling is most appropriately implemented using an air mover that is compact and is also adapted to drive a relatively large air volume flow, delivering a high cooling capacity.

FIG. 2A illustrates an example of tube-axial fan 200 including a rotor 202 and attached blades 204, mounted in a frame 206. The tube-axial fan 200 is constructed of a suitable material such as metal or durable plastic. A suitable tube-axial fan 200 is a high-power fan that enables a very high flow rate at a very high static pressure.

FIGS. 2B(i) and 2B(ii) illustrate a side view and a transparent, perspective view of a high flow rate air mover 210 with aerodynamic rotor 212 and multiple blades 214, for example arranged in a plurality of positions along the rotor longitudinal axis. The rotor 212 and blades 214 are contained within an aerodynamically-shaped, generally cylindrical housing 216.

Figure 2C:
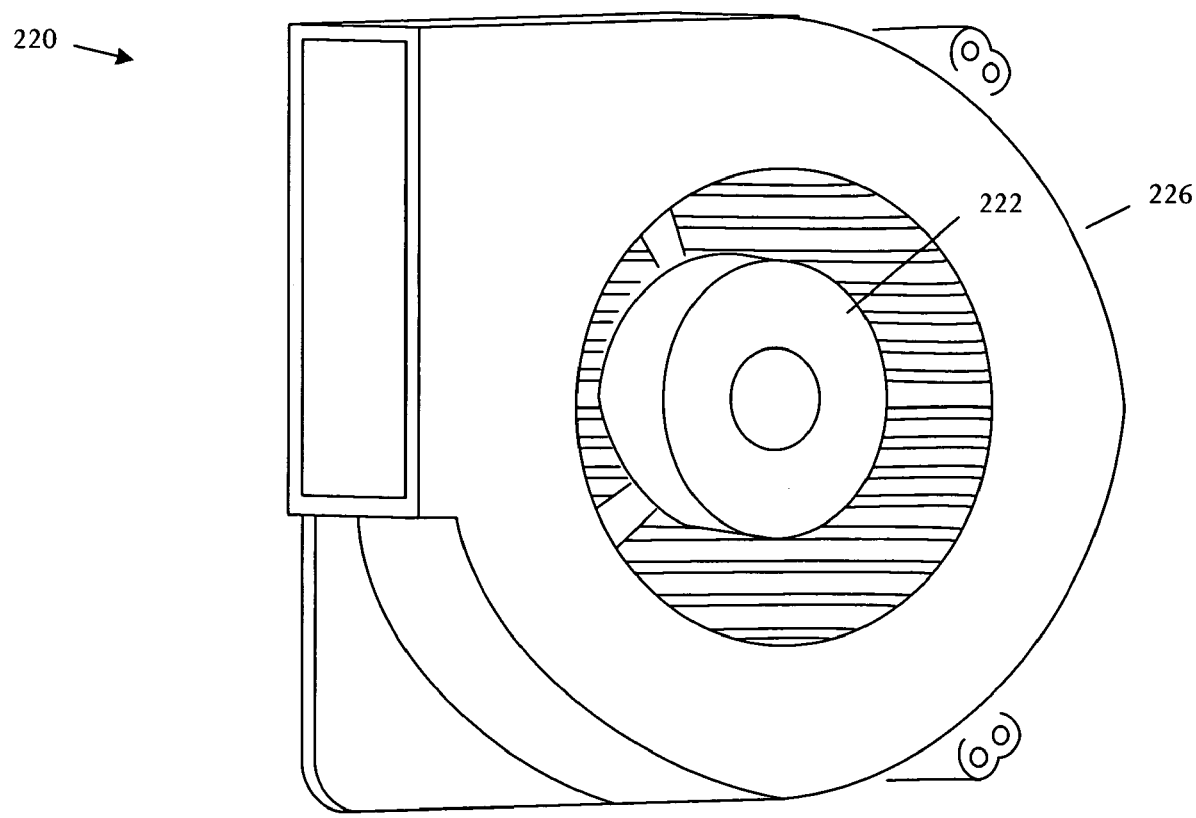
FIG. 2C is a perspective pictorial view showing a blower that may be a suitable air mover for usage in the illustrative cooling apparatus.

FIG. 2C depicts an example embodiment of an air mover in the form of a turbine-type blower 220 that is useful for impingement cooling and enables a very high flow rate at a very high static pressure. The blower 220 comprises an impeller 222 and frame 226 constructed from plastic, and includes bearings to facilitate rotation.

In a particular example, an air mover may be adapted to function at a very high flow rate of greater than 50 cubic feet per minute (CFM) and a very high static pressure of greater than 2 inches of water. In various configurations, a diverse selection of flow rate and static pressure criteria may be implemented based on a wide variety of conditions including the amount and concentration of heat produced, system ventilation, system spatial considerations, flexible tubing length and diameter, and others. For example, either higher or lower static pressures may be appropriate. Similarly, higher or lower flow rates may be appropriate.

Generally, the air mover for impingement cooling operates at a very high static pressure and very high flow rate, resulting in a pressure drop which is substantially in excess of the pressure drop attained with common fan technology.

Spatial considerations in compact servers, blades, and computers typically make appropriate usage of a fan with smaller form factor. In an illustrative embodiment, the air mover may have a small package size of less than approximately 250 cubic centimeters, for example with a height of 40 mm, a width of 50 mm, and a depth of 80 mm. In other implementations and usages, larger air movers may be used. Similarly, smaller air movers are typically sought in accordance with thermal requirements in a particular application and advances in air mover technology.

In an electronic system application such as a compact blade server, computer system, or similar electronic device, the air mover adapted to produce an increased or maximized heat transfer coefficient for thermal management is generally selected on the basis of capacity for cooling and compactness. A suitable cooling capacity is one sufficient to produce a very high airflow velocity.

Figure 3A:
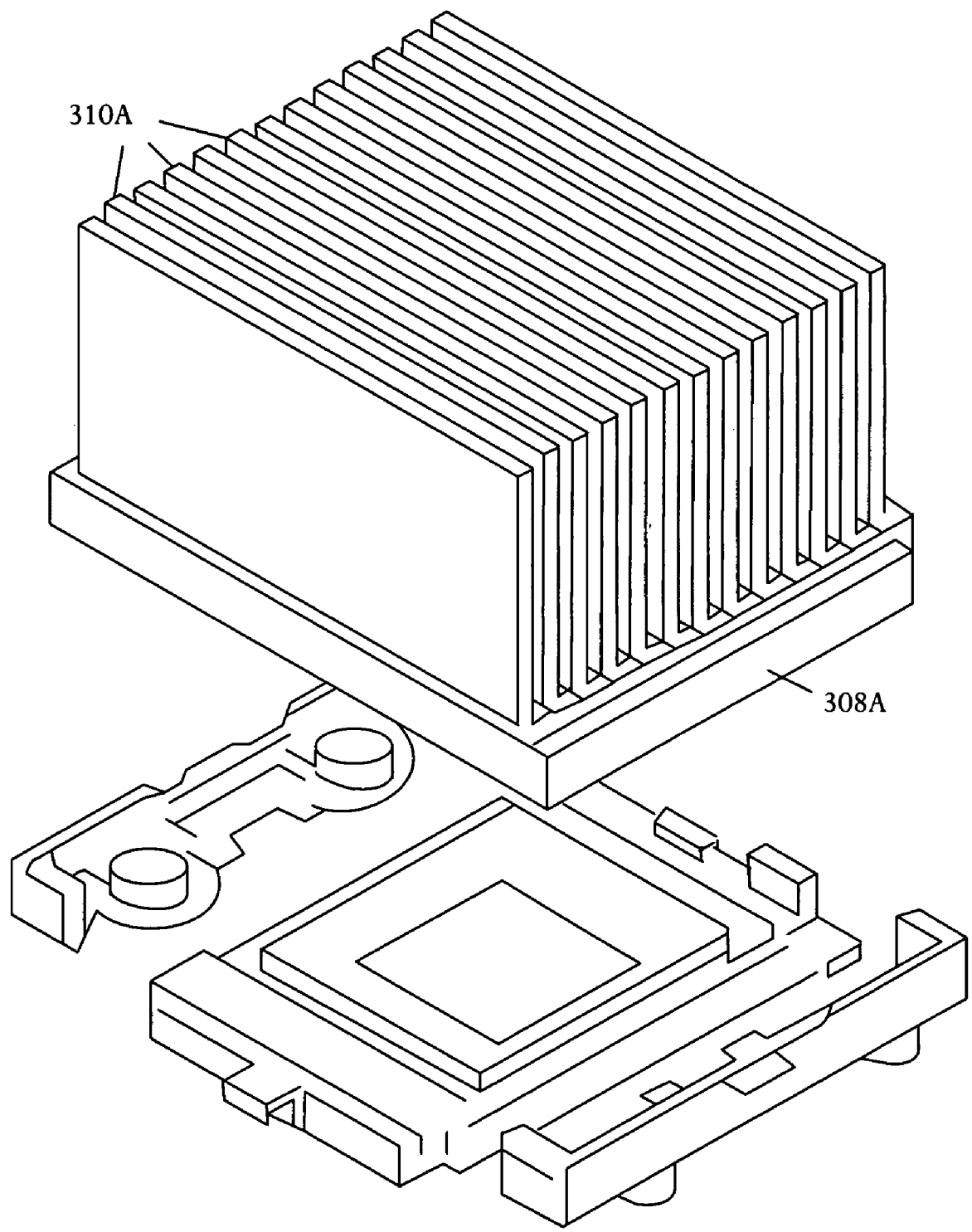
FIGS. 3A and 3B are perspective pictorial diagrams illustrating embodiments of heat sinks that may be suitable for usage in impingement cooling applications.
Figure 3B:
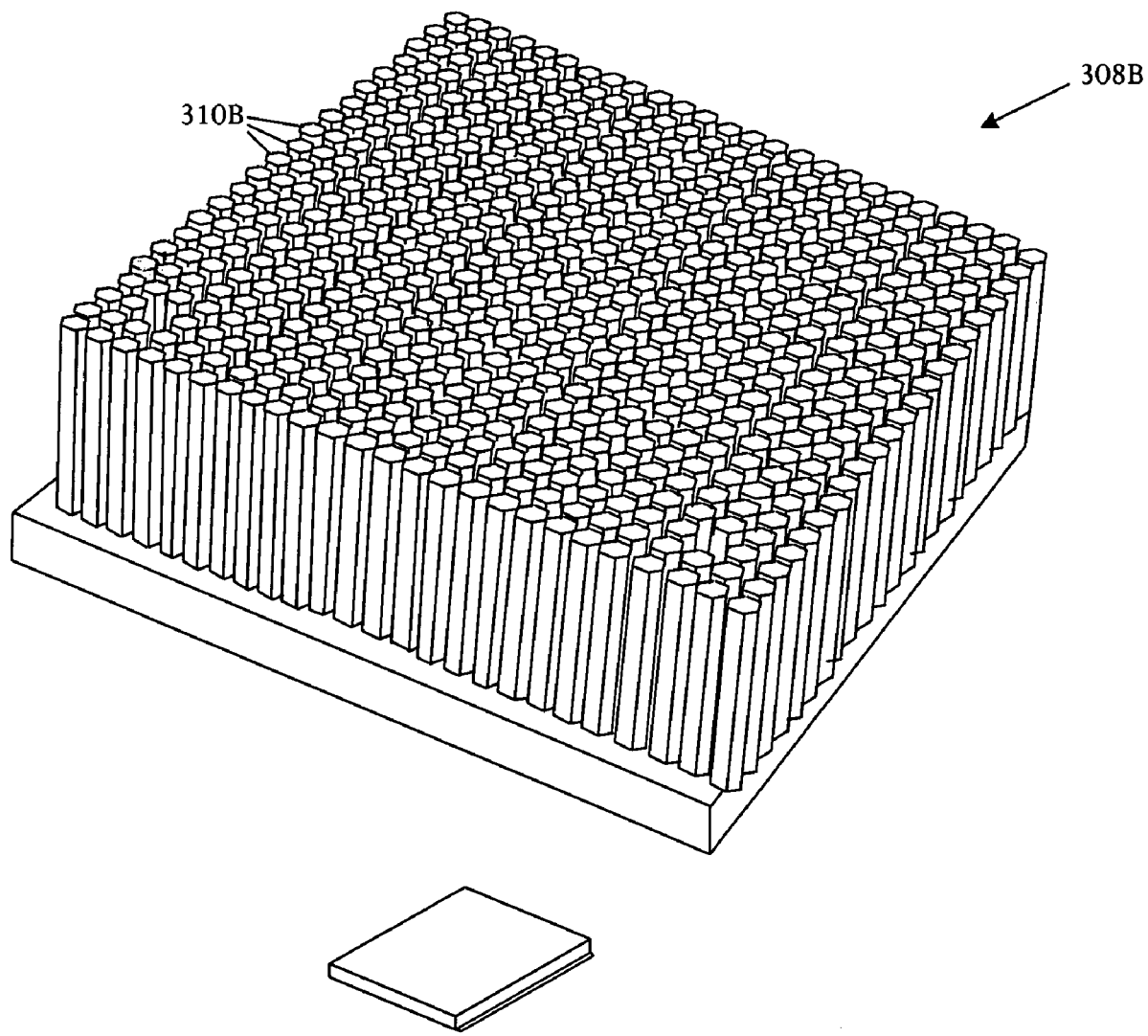

Referring to FIGS. 3A and 3B, perspective pictorial diagrams illustrate embodiments of heat sinks 308A and 308B that may be suitable for usage in impingement cooling applications. Heat sinks of various sizes, shapes, structures, materials, and technologies may be used. Heat sinks typically have multiple attached fins 310A and 310B. Any suitable type of fins may be used for the impingement cooling application, for example including plate fins, circular pin fins, square pin fins, elliptical pin fins, hexagonal pin fins, polygonal pin fins, foil fins, stampings, wire fins, louvers, sheets, metal foams, and other materials capable of producing a cooling effect. The fins can be arranged in any suitable configuration including parallel, staggered, in-line, and other geometrical arrangements. FIG. 3A illustrates an embodiment of a heat sink 308A with plate fins 310A configured in parallel. FIG. 3B depicts an embodiment of a heat sink 308B with hexagonal pin fins 310B.

Figure 4A:
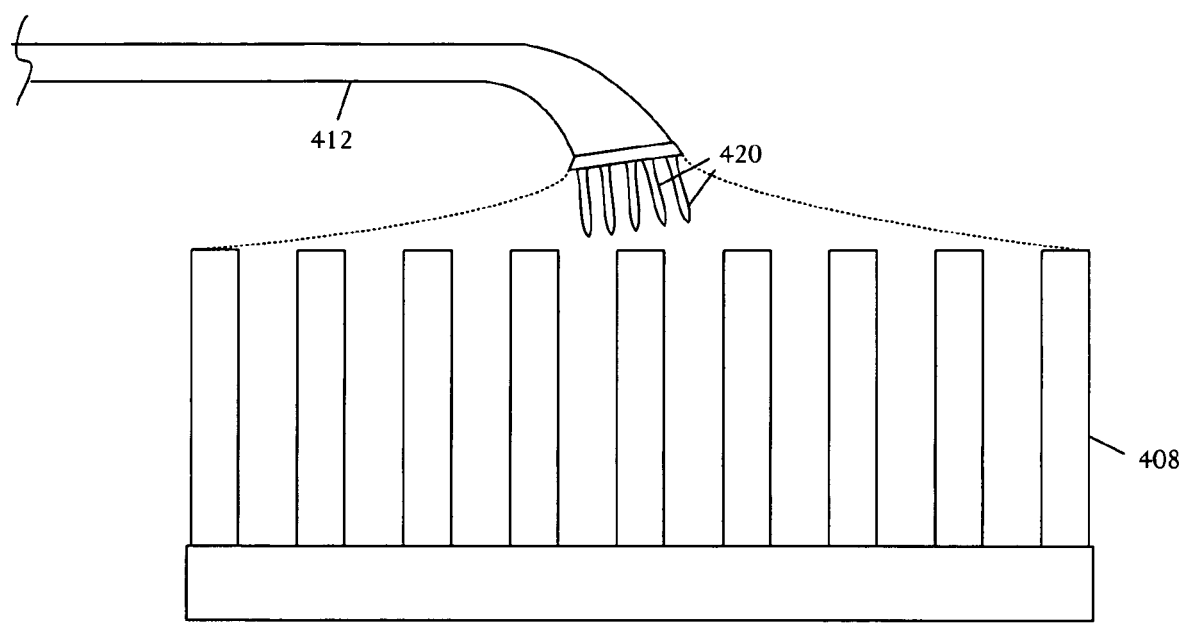
FIGS. 4A, 4B, and 4C are schematic pictorial diagrams showing side views of cooling apparatus implementations comprising a heat sink and a flexible tubing segment with multiple flexible tubules configured in an array applying airflow directly toward the heat sink.
Figure 4B:
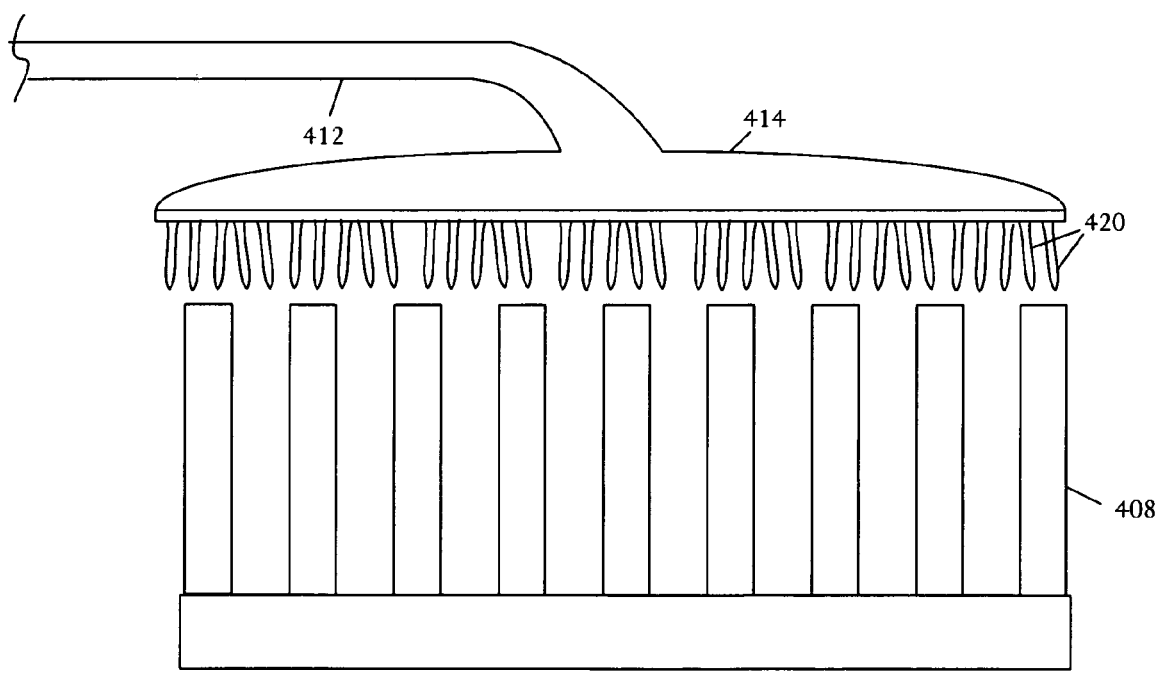
Figure 4C:
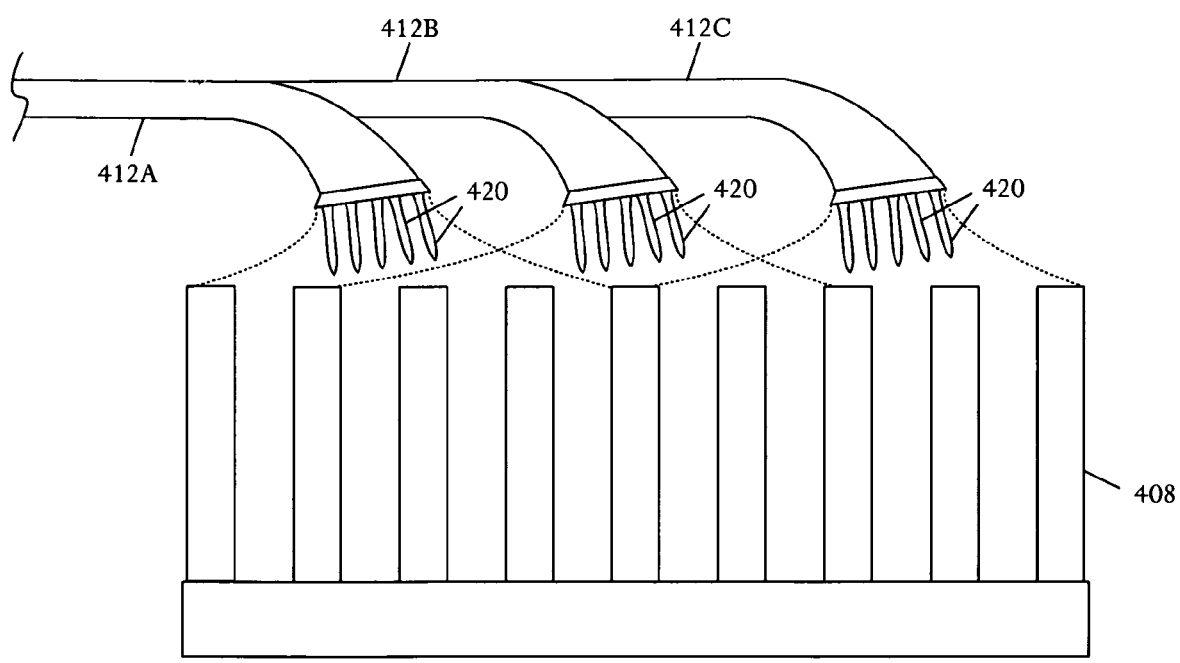

Cooling using an air mover with high flow rate and high static pressure can be implemented in many ways. For example referring to FIG. 4A, a schematic pictorial diagram illustrates a side view of a cooling apparatus implementation comprising a heat sink 408 and a flexible tubing segment 412 with multiple flexible tubules 420 configured in an array adjacent and directing airflow directly toward the heat sink 408. The multiple tubules 420 can be arrayed at the top of the heat sink 408 to spray air essentially throughout the heat sink surface. In some embodiments, for example as shown in FIG. 4B, a manifold 414 may be positioned over the heat sink 408 or other object subject to cooling to facilitate distribution of the cooling fluid over the area of the heat sink 408 relative to the tiny cross-sectional area of the tubing segment 412. In another example, such as shown in FIG. 4C, multiple tubing segments 412A, 412B, 412C may be arranged to direct fluid flow over the heat sink 408 so that relatively even distribution is attained.

Figure 5:
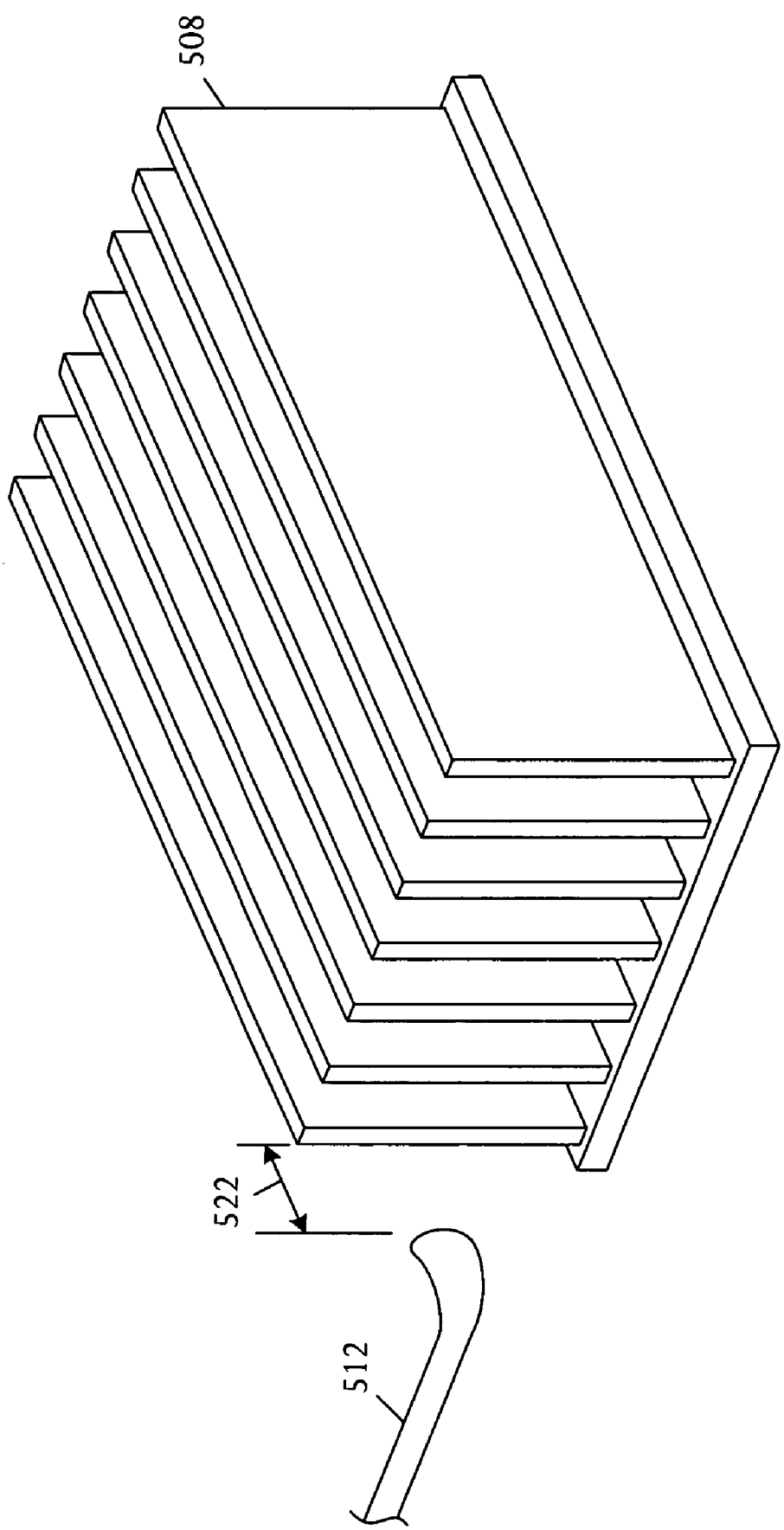
FIG. 5 is a schematic pictorial diagram illustrating a perspective view of an embodiment of a cooling apparatus comprising a plenum space adjacent the heat sink.

Referring to FIG. 5, a schematic pictorial diagram illustrates a perspective view showing an embodiment of a cooling apparatus comprising a plenum space 522 adjacent the heat sink 508. A tubing segment 512 feeds the plenum space 522 in an arrangement that spreads airflow across the heat sink 508.

Figure 6A:
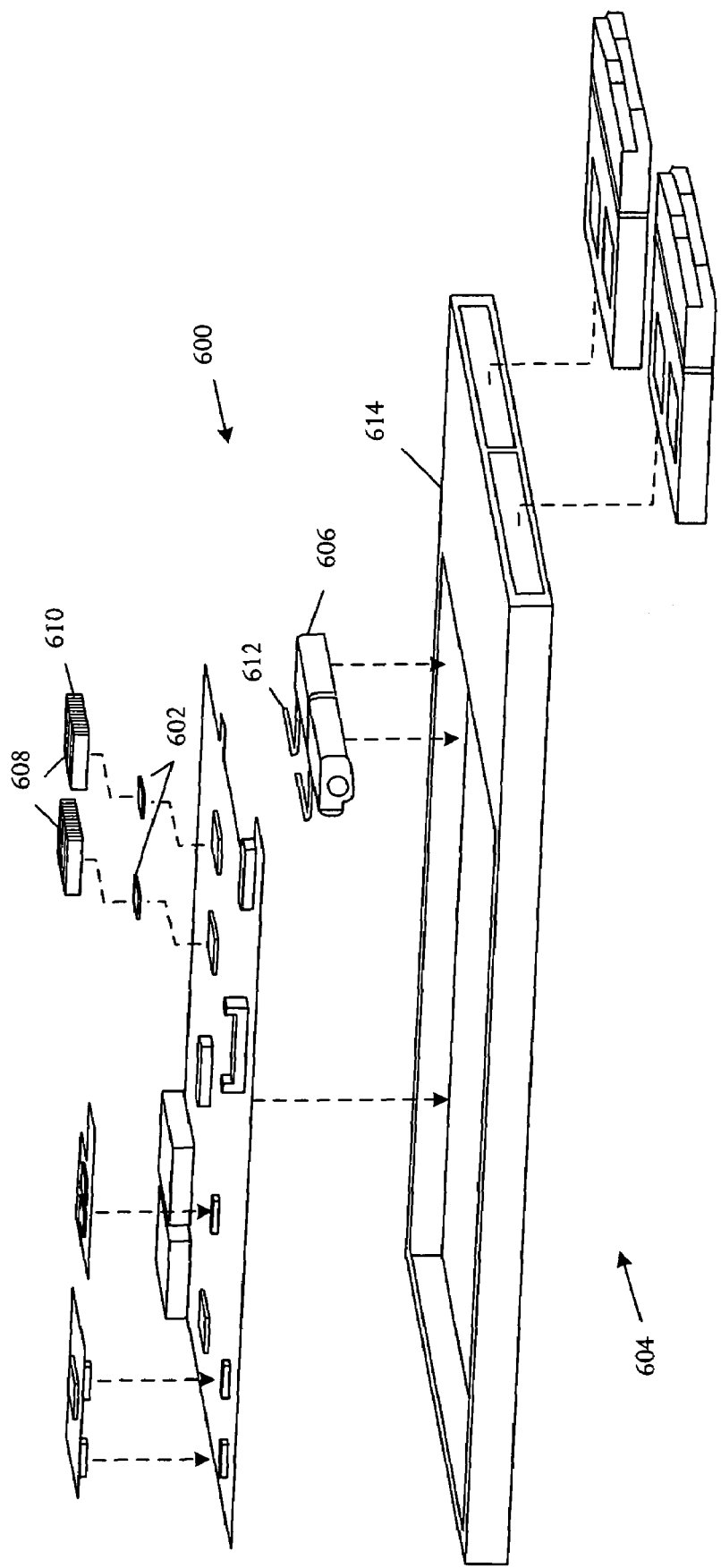
FIGS. 6A and 6B are schematic pictorial diagrams respectively depicting exploded and combined views of an embodiment of an electronic system which implements impingement cooling of electronic components.
Figure 6B:
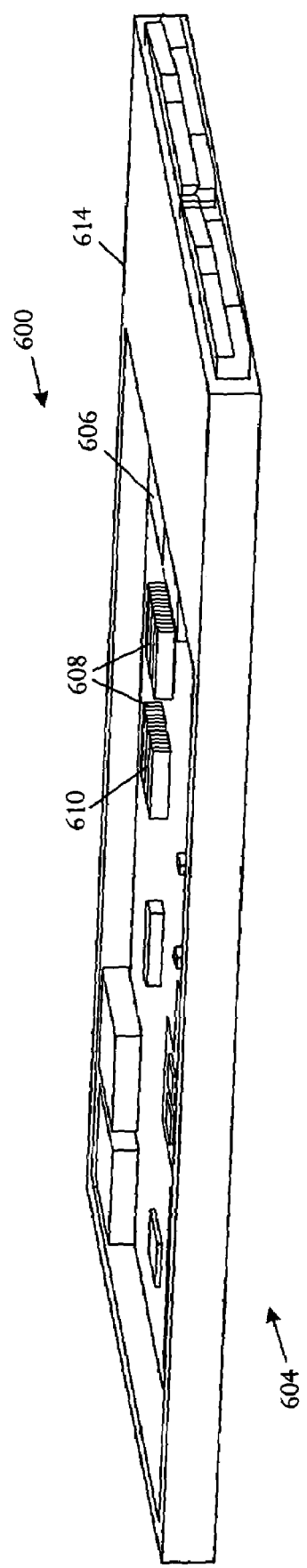

Referring to FIGS. 6A and 6B, schematic pictorial diagrams respectively illustrate an exploded and a combined view of an embodiment of an electronic system 604 which implements impingement cooling of electronic components 602. The electronic system 604 comprises a chassis 614, one or more electronic components 602 distributed in the chassis 614, and a cooling apparatus 600 adapted for usage in an electronic system 604. The cooling apparatus 600 comprises an air mover 606, one or more heat sinks 608 configured with multiple fins 610 and associated with selected electronic components 602, and one or more flexible tubing segments 612. The flexible tubing 612 is connected to the air mover 606 and is configured to direct airflow onto the heat sinks 608 for impingement cooling. In the illustrative embodiment, the air mover 606 is positioned inside the chassis 614.

In a particular application, the illustrative configuration performs impingement cooling within a computer chassis 614 enabling high-pressure, high-velocity airflow production due to the combined and coordinated functionality of the high-power air mover 606 and flexible, small-diameter tubing 612 which may be easily routed within the computer chassis 614 to selected heat sinks 608 and associated electronic components 602, such as high-power, high-heat dissipation processors. Impingement cooling is a highly effective technique for air-cooling in an electronic device. Impingement cooling drives air at high velocity toward a hot component 602, typically increasing or maximizing the heat transfer coefficient.

The electronic system 604 is configured for thermal management by placing one or more heat sinks 608 in an arrangement adapted for cooling selected electronic components 602 located within the chassis 614.

A suitable air mover 606 for usage in impingement cooling is selected according to capacity to deliver a suitable airflow velocity. Flexible tubing 612 is selected and attached to the air mover 606. The flexible tubing 612 is selected which has a length sufficient to extend from the air mover 606 to the applicable heat sink or heat sinks 608 and has an internal lumen defined by an appropriately small diameter to create, in combination with the air mover, the predetermined high airflow velocity. The tubing 612 is positioned in a configuration that extends from the air mover 606 to the selected heat sinks 608 and enables airflow to be blown directly onto the heat sinks 608.

Figure 7:
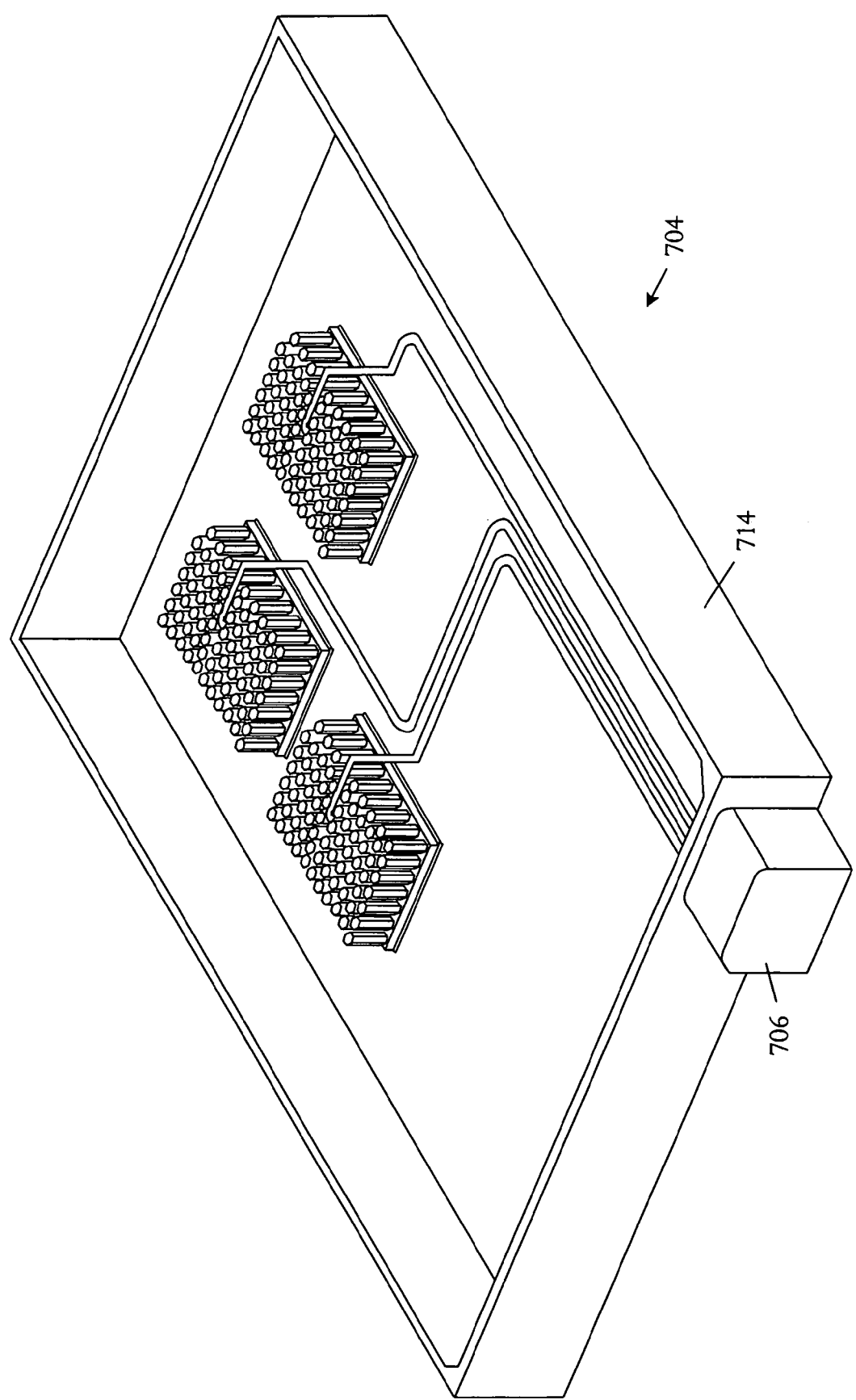
FIG. 7 is a pictorial diagram illustrating an embodiment of an electronic system with an air mover selectively located outside a chassis.

The air mover may be located inside or outside the chassis. Referring to FIG. 7, a pictorial diagram depicts an embodiment of an electronic system 704 with an air mover 706 selectively located outside a chassis 714.

Multiple heat sinks and associated electronic components may be cooled using the illustrative techniques and/or structures. Removal or addition of heat sinks to the system is straight-forward, relatively simple, and performed by movement of flexible tubes. In various configurations, cooling system modification may be performed while the electronic system is operational. The illustrative thermal management and control techniques and structures are typically less sensitive to the condition of an open chassis cover than conventional thermal management implementations using airflow pathways generated by air movers because the cooling air path is controlled.

Referring to FIG. 8, a schematic graph depicts fan characteristic and system curves showing fan and system performance in a plot of pressure differential ($\Delta P$) against air flow (Q). A fan characteristic curve 810 shows air flow driven by a fan through a system. The fan characteristic curve 810 is shown crossing system characteristic curves 820 and 822. System characteristic curve 820 illustrates an example of airflow resistance for a fan that directs air into a cavity within a housing. System characteristic curve 822 shows an example of airflow resistance for a higher flow resistance object, for example that results for the configuration of a high static pressure and high velocity air mover connected to a flexible, small internal diameter lumen tubing. The system resistance curves 820 and 822 have a maximum pressure drop at zero flow and a maximum air flow at zero pressure drop.

The intersection of the fan characteristic curve 810 and the system curve is the operating point. Accordingly, the operating point 830 is the intersection of the fan characteristic curve 810 and the system curve 820 for driving air into the housing cavity. The operating point 832 is the intersection of the fan characteristic curve 810 and the system curve 822 for the tubing implementation. Usage of the small-diameter tubing to deliver high-velocity air shifts the operating point of the fan left, enabling a relatively small fan with relatively small motor size to efficiently perform impingement cooling.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, a few specific examples of air mover or fan structures, heat sink configurations, air mover arrangements, and air mover and tubing segment number are depicted. Any suitable arrangement of configuration of air movers, heat sinks, and tubing arrangements may be implemented. The illustrative cooling devices may be used in any appropriate electronic system or device, such as suitable servers, computers, consumer electronics devices, communication systems and devices, storage system, and others.

In the claims, unless otherwise indicated the article "a" is to refer to "one or more than one."

What is claimed is:

1. A cooling apparatus adapted for usage in an electronic system comprising:

at least one heat sink configured with multiple fins;
a high-speed airflow air move; and
at least one flexible tubing segment with a narrow internal diameter coupled to the air mover in an arrangement that directs airflow onto the at least one heat sink, the air mover creating a sufficient high-speed airflow and the narrow internal diameter of the at least one flexible tubing segment creating a sufficiently large pressure drop for impingement cooling of the at least one heat sink wherein very thin hydrodynamic and thermal boundary layers definitive of impingement cooling are formed in an impingement region as a result of air deceleration and pressure increase and a stagnation zone of peak heat transfer is created due to high heat transfer coefficient.

2. The apparatus according to claim 1 wherein:
the air mover that creates a sufficient high-speed airflow drives air at a very high flow rate of greater than 50 cubic feet per minute (CFM) and a very high static pressure of greater than 2 inches of water.

3. The apparatus according to claim 2 wherein:
the air mover that creates a sufficient high-speed airflow has a small package size of less than approximately 250 cubic centimeters.

4. The apparatus according to claim 1 further comprising:
a plurality of flexible tubules with narrow internal diameters configured in an array adjacent and directing airflow directly onto a heat sink of the at least one heat sink, the air mover creating a sufficient high-speed airflow and the narrow internal diameters of the flexible tubules creating a sufficiently large pressure drop for impingement cooling of the at least one heat sink wherein very thin hydrodynamic and thermal boundary layers definitive of impingement cooling are formed in an impingement region as a result of air deceleration and pressure increase and a stagnation zone of peak heat transfer is created due to high heat transfer coefficient.

5. The apparatus according to claim 1 further comprising:
a plenum space adjacent a heat sink of the at least one heat sink; and
a tubing segment of the at least one flexible tubing segments feeding the plenum space in an arrangement that spreads airflow across the heat sink.

6. The apparatus according to claim 1 further comprising:
multiple fins coupled to ones of the at least one heat sink, the fins being selected from among a group consisting of plate fins, circular pin fins, square pin fins, elliptical pin fins, hexagonal pin fins, polygonal pin fins, foil fins, stampings fins, wire fins, louvers, metal foams, and sheets, and the fins can be arranged in a configuration consisting of parallel, staggered, in-line, and other geometrical shapes.

7. An electronic system comprising:
a chassis;
at least one electronic component distributed in the chassis; and
a cooling apparatus adapted for usage in the electronic system comprising:
  at least one heat sink configured with multiple fins and associated with selected ones of the at least one electronic components;
  a high-speed airflow air mover; and at least one flexible tubing segment with a narrow internal diameter coupled to the air mover in an arrangement that directs airflow onto the at least one heat sink, the air mover creating a sufficient high-speed airflow and the narrow internal diameter of the at least one flexible tubing segment creating a sufficiently large pressure drop for impingement cooling of the at least one heat sink wherein very thin hydrodynamic and thermal boundary layers definitive of impingement cooling are formed in an impingement region as a result of air deceleration and pressure increase and a stagnation zone of peak heat transfer is created due to high heat transfer coefficient.

8. The system according to claim 7 wherein:
the air mover that creates a sufficient high-speed airflow drives air at a very high flow rate of greater than 50 cubic feet per minute (CFM) and a very high static pressure of greater than 2 inches of water.

9. The system according to claim 8 wherein:
the air mover that creates a sufficient high-speed airflow has a small package size of less than approximately 250 cubic centimeters.

10. The system according to claim 8 wherein:
the air mover is selectively positioned inside the chassis or outside the chassis.

11. The system according to claim 7 further comprising:
a plurality of flexible tubules with narrow internal diameters configured in an array adjacent and directing airflow directly onto a heat sink of the at least one heat sink, the air mover creating a sufficient high-speed airflow and the narrow internal diameters of the flexible tubules creating a sufficiently large pressure drop for impingement cooling of the at least one heat sink wherein very thin hydrodynamic and thermal boundary layers definitive of impingement cooling are formed in an impingement region as a result of air deceleration and pressure increase and a stagnation zone of peak heat transfer is created due to high heat transfer coefficient.

12. The system according to claim 7 further comprising:
a plenum space adjacent a heat sink of the at least one heat sink; and
a tubing segment of the at least one flexible tubing segments feeding the plenum space in an arrangement that spreads airflow across the heat sink.

13. The system according to claim 7 further comprising:
multiple fins coupled to ones of the at least one heat sink, the fins being selected from among a group consisting of plate fins, circular pin fins, square pin fins, elliptical pin fins, hexagonal pin fins, polygonal pin fins, foil fins, stampings fins, wire fins, louvers, metal foams, and sheets, and the fins can be arranged in a configuration consisting of parallel, staggered, in-line, and other geometrical shapes.

14. A method of cooling an electronic system comprising:
arranging at least one heat sink in a configuration adapted to cool one or more selected electronic components in the electronic system;
attaching a high-speed air mover to the electronic system;
attaching at least one flexible tubing segment with a narrow internal diameter to the air mover, the air mover creating a sufficient high-speed airflow and the narrow internal diameter of the at least one flexible tubing segment creating a sufficiently large pressure drop for impingement cooling of the at least one heat sink wherein very thin hydrodynamic and thermal boundary layers definitive of impingement cooling are formed in an impingement region as a result of air deceleration and pressure increase and a stagnation zone of peak heat transfer is created due to high heat transfer coefficient; and
arranging the at least one tubing segment in a configuration that directs airflow onto the at least one heat sink whereby the at least one heat sink is cooled by impingement cooling.

15. The method according to claim 14 further comprising:
attaching the air mover that creates a sufficient high-speed airflow that drives air at a very high flow rate of greater than 50 cubic feet per minute (CFM) and a very high static pressure of greater than 2 inches of water.

16. The method according to claim 15 further comprising:
attaching the air mover that creates a sufficient high-speed airflow that has a small package size of less than approximately 250 cubic centimeters.

17. A method of cooling an electronic component comprising:
positioning a heat sink adjacent the electronic component; and
blowing an airflow stream onto the heat sink with a high velocity and pressure drop sufficient for impingement cooling of the electronic component wherein very thin hydrodynamic and thermal boundary layers definitive of impingement cooling are formed in an impingement region as a result of air deceleration and pressure increase and a stagnation zone of peak heat transfer is created due to high heat transfer coefficient.

18. The method according to claim 17 further comprising:
coupling a flexible tubing to the air mover and positioning the flexible tubing to extend to the heat sink for blowing onto the heat sink, the flexible tubing having a small internal diameter sufficient to create in combination with the air mover a high velocity sufficient for impingement cooling of the electronic component.

19. The method according to claim 17 further comprising:
attaching the air mover that creates a sufficient high-speed airflow that is adapted to function at a very high flow rate of greater than 50 cubic feet per minute (CFM) and a very high static pressure of greater than 2 inches of water.

* * * * *

UNITED STATES PATENT AND TRADEMARK OFFICE
CERTIFICATE OF CORRECTION

PATENT NO. : 7,548,421 B2  Page 1 of 1
APPLICATION NO. : 11/259544
DATED : June 16, 2009
INVENTOR(S) : Christopher G. Malone et al.

It is certified that error appears in the above-identified patent and that said Letters Patent is hereby corrected as shown below:

In column 7, line 2, in Claim 1, delete "move;" and insert -- mover; --, therefor.

Signed and Sealed this

Twenty-second Day of December, 2009

David J. Kappos
*Director of the United States Patent and Trademark Office*